United States Patent
Weng

(10) Patent No.: US 6,930,044 B1
(45) Date of Patent: Aug. 16, 2005

(54) METHOD FOR FABRICATING A PACKAGING SUBSTRATE

(75) Inventor: Yi-Tang Weng, Tao-Yuan (TW)

(73) Assignee: Nan Ya Printed Circuit Board Corporation, Taoyuan (TW)

( * ) Notice: Subject to any disclaimer, the term of this patent is extended or adjusted under 35 U.S.C. 154(b) by 0 days.

(21) Appl. No.: 10/710,669

(22) Filed: Jul. 28, 2004

(30) Foreign Application Priority Data

Mar. 17, 2004 (TW) .............................. 93107165 A

(51) Int. Cl.[7] ............................................. H01L 21/44
(52) U.S. Cl. ...................... 438/671; 438/687; 438/686
(58) Field of Search ............................... 438/671, 686, 438/687, 612, 613, 622, 734, 735, 738, 739, 438/740, 745, 589, 597, 455, 584, 770, 106, 438/942, 943

(56) References Cited

U.S. PATENT DOCUMENTS 5,508,229 A * 4/1996 Baker ......................... 438/614
5,565,379 A * 10/1996 Baba ........................... 438/614
6,451,712 B1 * 9/2002 Dalton et al. ............... 438/781
6,576,540 B2 * 6/2003 Hsu et al. .................... 438/612

FOREIGN PATENT DOCUMENTS

TW          538512          6/2003

* cited by examiner

Primary Examiner—David Nhu
(74) Attorney, Agent, or Firm—Winston Hsu

(57) ABSTRACT

A method for making a packaging substrate is provided. A thin copper seed layer is formed on a carrier plate. A first resist layer is coated on the thin copper seed layer. The first resist layer defines a wire layout of copper plating area. A layer of copper is then electroplated on the copper plating area to form the wire layout. After this, the first resist layer is stripped to expose the wire layout and the thin copper seed layer. A patterned second resist layer is formed on the wire layout. The patterned second resist layer defines the Ni/Au plating area of the wire layout. The copper seed layer that is not covered by the second resist layer is etched away. A third resist layer is stacked on the second resist layer and defines an Au-plating area of the I/O fingers. Using the third resist layer as a plating hard mask, a layer of Ni/Au layer is plated on the exposed area of the wires. After this step, the second and third resist layers are removed.

12 Claims, 10 Drawing Sheets

METHOD FOR FABRICATING A PACKAGING SUBSTRATE

BACKGROUND OF INVENTION

1. Field of the Invention

The present invention relates generally to the field of circuit boards. More particularly, the present invention relates to a method for manufacturing a packaging substrate. Two selective etching steps are utilized to define the Au-plating area and the non-Au-plating area.

2. Description of the Prior Art

As the functionality and performance of network systems, high-end servers, and mobile communication devices improves, the demand for high-performance, high pin count packages is increasing. This increasing demand requires new technologies, which incorporate high pin count and also delivers performance via impedance control, low crosstalk, DC/AC resistance, and low VG impedance. Sophisticated interconnect technology has become essential for meeting these needs by improving the density and reliability of the substrates for LSI package and module boards. While high-density packages such as flip-chip and BGA devices permit very high input-output (I/O) counts, the resulting close dimensions introduce substantial yield and cost challenges.

As known in the art, dense circuit patterns with intensive fine copper lines that are electrically connected to a number of contact pads are fabricated on the surface of the packaging substrate for the transmission of electronic signals or power. On the top surface of the electrical contact pads, a Ni/Au layer, which is also referred to as "soft gold layer", is typically formed with electroplating to ensure that the bonding pads are in excellent electrical coupling with a circuit of a chip. Furthermore, other electrical contact pads of a substrate, solder ball pads for example, are covered with a Ni/Au layer electroplated on the surface, so that the conducting pads (usually made of copper composition) of the solder ball pads can be prevented from oxidation to improve the electrical interconnection performance of the solder ball pads. After the Ni/Au layer plating, surface finish processes such as solder mask coating are then carried out to finish the manufacturing of the packaging substrate.

To fabricate a packaging structure, in accordance with some prior art methods in the public domain, it is required to dispose a plurality of conducting wires for electroplating. These conducting wires are also known as "plating bus", which are used to assist the electroplating process for forming the Ni/Au structure electroplated on the contact pads. However, These conducting wires occupy a large amount of area, thus leading to sacrificing the surface area for functional circuit layout pattern. Another drawback of employing plating bus is that when operating at high frequency, noise due to the antenna effect may occur, and thus adversely affecting chip performance.

U.S. Pat. No. 6,576,540 filed Mar. 22, 2002, entitled "Method for fabricating substrate within a Ni/Au structure electroplated on electrical contact pads", teaches a method comprising the steps of: providing a substrate with a circuit layout pattern and forming a conducting film on the surface of the substrate; depositing a first photoresist layer within an opening on said electrical conducting film surface to expose a portion of said circuit layout pattern to be electrical contact pads; removing the exposed conducting film uncovered by the first photoresist layer; depositing a second photoresist layer, covering the conducting film exposed in the openings of the first photoresist layer; electroplating Ni/Au covering the surface of the electrical contact pads; removing the first and second photoresists, and the conducting film covered by the photoresists; depositing solder mask on the substrate within an opening to expose said electrical contact pads.

The method disclosed in U.S. Pat. No. 6,576,540 has several shortcomings. First, the process is costly because an additional metallization is needed after the patterning of circuit lines on the substrate. In addition, the fine conductive lines on the substrate might be unwarily scratched or damaged due to collision. Furthermore, metal peeling problem is also an issue that potentially affecting the production yield.

Taiwanese Pat. Pub. No. 538,512, which is incorporated herein by reference, teaches a process for making packaging substrate by utilizing stacked photoresist image transfer layers. However, the process disclosed in this patent has a Ni/Au overhang problem due to that the sidewalls of the contact pad are not covered by the Ni/Au layer. The exposed sidewalls of the contact pads may be oxidized resulting in short circuiting or reliability concerns.

In light of the above, there is a strong need in the packaging industry to provide a cost-effective method for manufacturing a packaging substrate to solve the above-described problems.

SUMMARY OF INVENTION

It is the primary object of the present invention to provide an improved method for fabricating a packaging substrate to cope with the above-described problems.

It is another object of the present invention to provide an improved method for fabricating a packaging substrate, which utilizes two selective etching steps to define Au-plating area and non-Au-plating area.

In accordance with the above objects, a preferred exemplary method for fabricating a packaging substrate of this invention is described and generally includes the following steps in the order of: (1) subtrate via through hole drilling; (2) through hole metallization; (3) first photoresist coating; (4) exposure, development, and definition of circuit pattern; (5) circuit pattern electroplating with copper; (6) photoresist stripping (7) second photoresist coating (8) exposure, development, and definition of the Au-plating area; (9) first selective etching; (10) third photoresist coating (11) exposure, development, and definition of masking area (non-Au-plating area); (12) Ni/Au electroplating; (13) photoresist stripping; (14) secondary selective etching; (15) solder mask coating; and (16) general surface finish (back-end) processes.

According to the claimed invention, a method for fabricating a packaging substrate is disclosed. A carrier plate having thereon at least one thin copper base layer is prepared. A first patterned photoresist layer is then formed on the thin copper base layer, said first patterned photoresist layer has a recessed trench area defining a copper circuit pattern. Copper is electroplated into the recessed trench area to form the copper circuit pattern. The first patterned photoresist layer is then removed. Thereafter, a second patterned photoresist layer exposing an Au-plating area of the copper circuit pattern is formed. The thin copper base layer exposed by the second patterned photoresist layer is etched away. A third patterned photoresist layer is formed on the second patterned photoresist layer to mend a recess under the second patterned photoresist layer. Using the third patterned photoresist layer as an electroplating mask, a conventional electroplating process is performed to electroplate a metal layer onto the copper circuit pattern in the Au-plating area. The second and third patterned photoresist layers are removed. The remaining thin copper base layer being exposed after stripping the second and third patterned photoresist layers is then removed.

The present invention comprises at least the following advantages. First, the cost per substrate is reduced since there is no need to coat an additional conductive metal layer for electroplating after the definition of circuit pattern layout. The conductive materials used to assist electroplating include the thin copper base layer and the chemically deposited copper layer. The potential scratch or collision damages can be effectively prevented since the entire circuit pattern is revealed at a later fabrication stage.

Further, metal peeling is avoided thereby promoting the production yield. Moreover, sidewalls of the circuit pattern in the Au-plating area are also covered by Ni/Au film and thus avoiding overhang problem.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

One preferred embodiment of the method of manufacturing packaging substrate in accordance with the present invention will be explained as follows referring to FIG. 1 to FIG. 10. FIG. 1 to FIG. 10 are perspective cross-sectional diagrams illustrating the present invention method of making a packaging substrate, which utilizes two selective etching steps to define Au-plating area and non-Au-plating area, and utilizes three photo image transferring steps.

Figure 1:
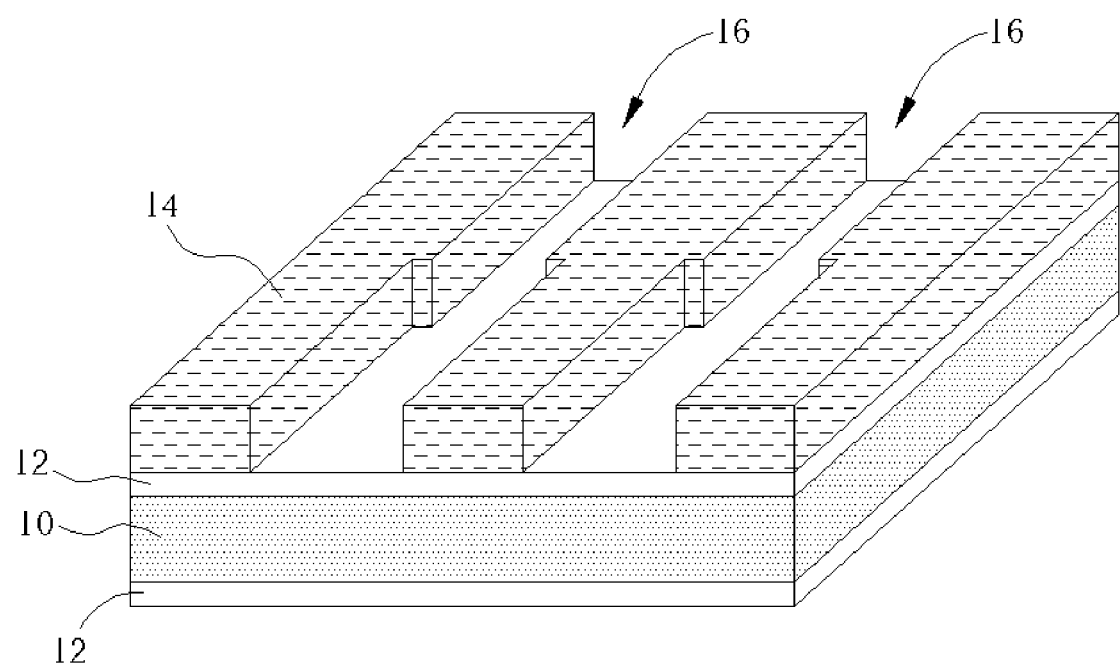
FIG. 1 to FIG. 10 are perspective cross-sectional diagrams illustrating the preferred embodiment according to the present invention method of making a packaging substrate, which utilizes two selective etching steps to define Au-plating area and non-Au-plating area, and utilizes three times photo image transferring steps.

As shown in FIG. 1, a carrier plate 10 made of insulating materials such as plastic is prepared. A number of via through holes or blind via hole (not shown) have been drilled in the carrier plate 10 by using conventional mechanical drilling or Laser drilling methods or the like. It is understood that the via through holes or blind via hole are not shown because they are known in the art and they are substantially not germane to the present invention. Via metallization process is then carried out to form a thin copper base layer (or copper seed layer) 12 on both sides of the carrier plate 10. Subsequently, a patterned photoresist layer 14 is formed on thin copper base layer 12. The photoresist layer 14 has recessed trench lines that expose a portion of the underlying thin copper base layer 12 and define a circuit pattern area 16 to be Cu plated.

The thin copper base layer 12 on the carrier plate 10 may be formed by performing the following steps: depositing a first copper layer on the surface of the carrier plate 10; polishing or chemically etching back the first copper layer to a thickness; drilling the carrier plate 10 with the polished first copper layer to form via through holes; metallizing the via through holes; and chemically depositing a second copper layer on the first copper layer, wherein the first copper layer and the second copper layer form the thin copper base layer 12 preferably having a thickness of less than 10 micrometers.

The patterned photoresist layer 14 that defines the circuit pattern area 16 to be Cu-plated is formed by using conventional lithographic process including exposure and development steps known in the art. It is to be understood that both sides of the carrier plate 10 can be used to form circuit patterns. For the sake of simplicity, the making of the circuit pattern and the method for making Ni/Au plated contact pads of this invention are illustrated using only one side of the carrier plate 10 through FIG. 1 to FIG. 10.

Figure 2:
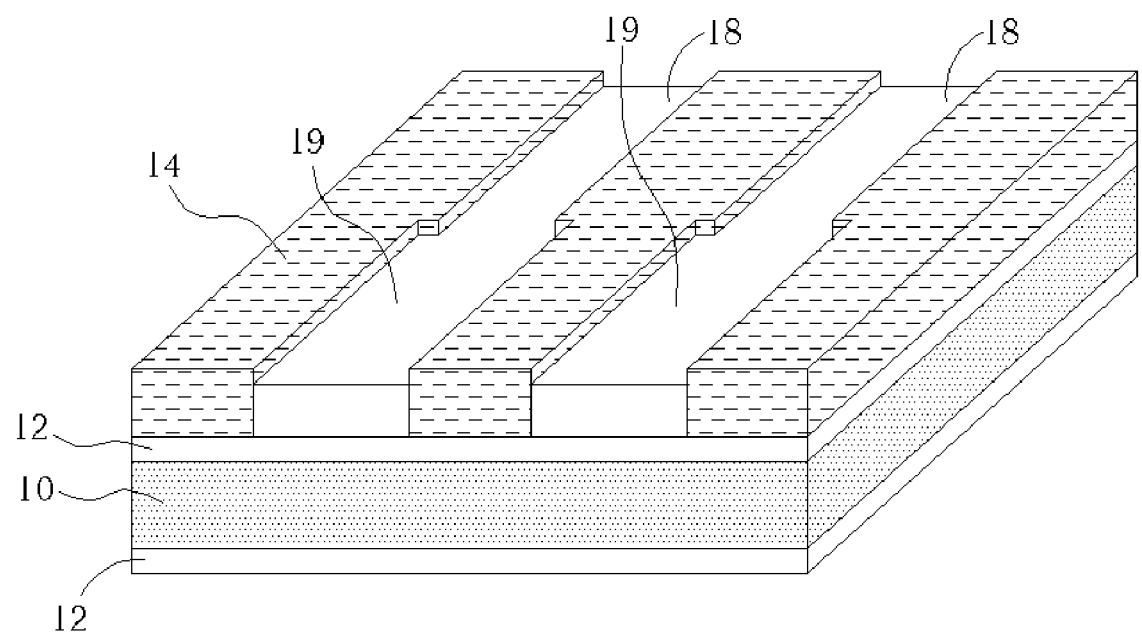

As shown in FIG. 2, in accordance with the preferred embodiment, an electroplating process is carried out to electroplating a conductive circuit pattern 18 such as copper circuit pattern on the exposed thin copper base layer 12 in the trench circuit pattern area 16. The thickness of the conductive circuit pattern 18 is about 20~40 micrometers. As specifically indicated in FIG. 2, the conductive circuit pattern 18 includes a terminal to-be-Au-plating area 19 that has a larger surface area.

Figure 3:
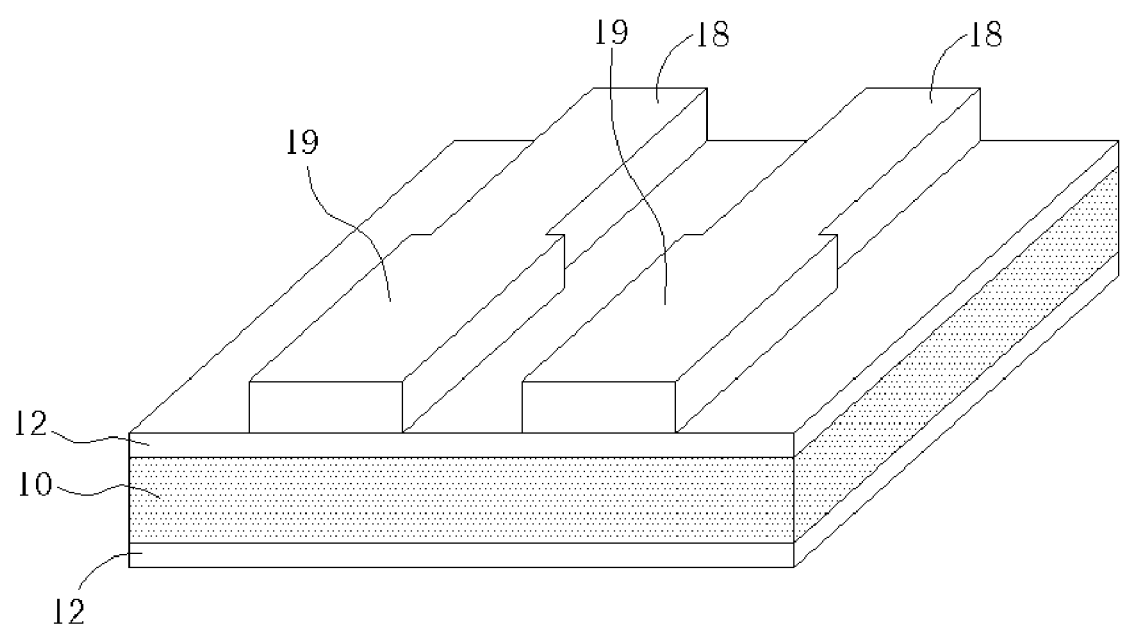

As shown in FIG. 3, the photoresist layer 14 is stripped off from the carrier plate 10, remaining the copper circuit pattern 18 including the sidewalls thereof intact on the thin copper base layer 12.

Figure 4:
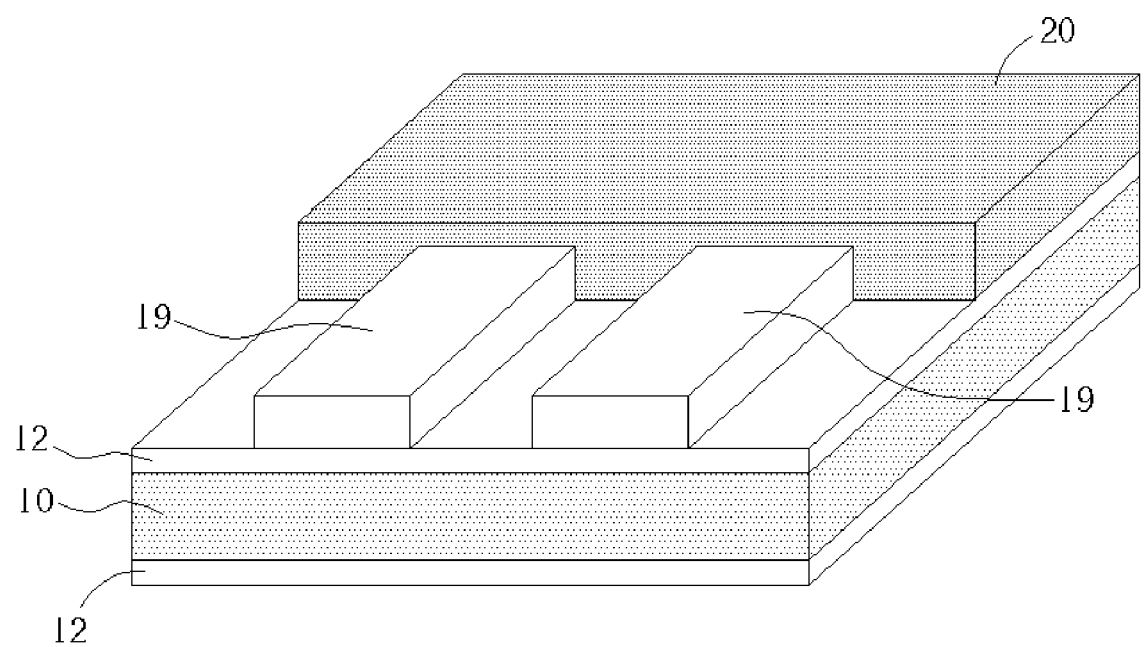

As shown in FIG. 4, a second photoresist coating is carried out. Conventional exposure and development processes are performed to form a patterned photoresist layer 20 on the carrier plate 10. The photoresist layer 20 masks the copper circuit pattern 18 except that in the to-be-Au-plating area 19.

Figure 5:
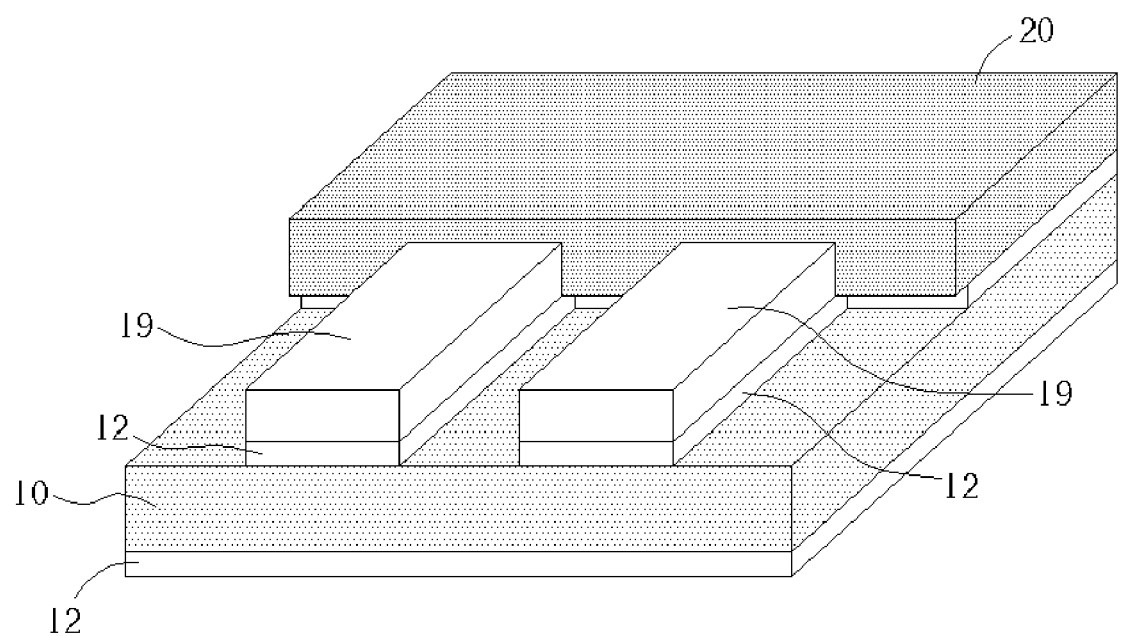

As shown in FIG. 5, using the photoresist layer 20 as an etching hard mask, a first selective etching process such as a wet etching is performed to etch away the thin copper base layer 12 that is not covered by the photoresist layer 20 and to-be-Au-plating area 19. A small thickness of the exposed copper circuit pattern 18 in the to-be-Au-plating area 19 is also etched away. A small portion of the thin copper base layer 12 under the edge of the photoresist layer 20 is etched away as well.

Figure 6:
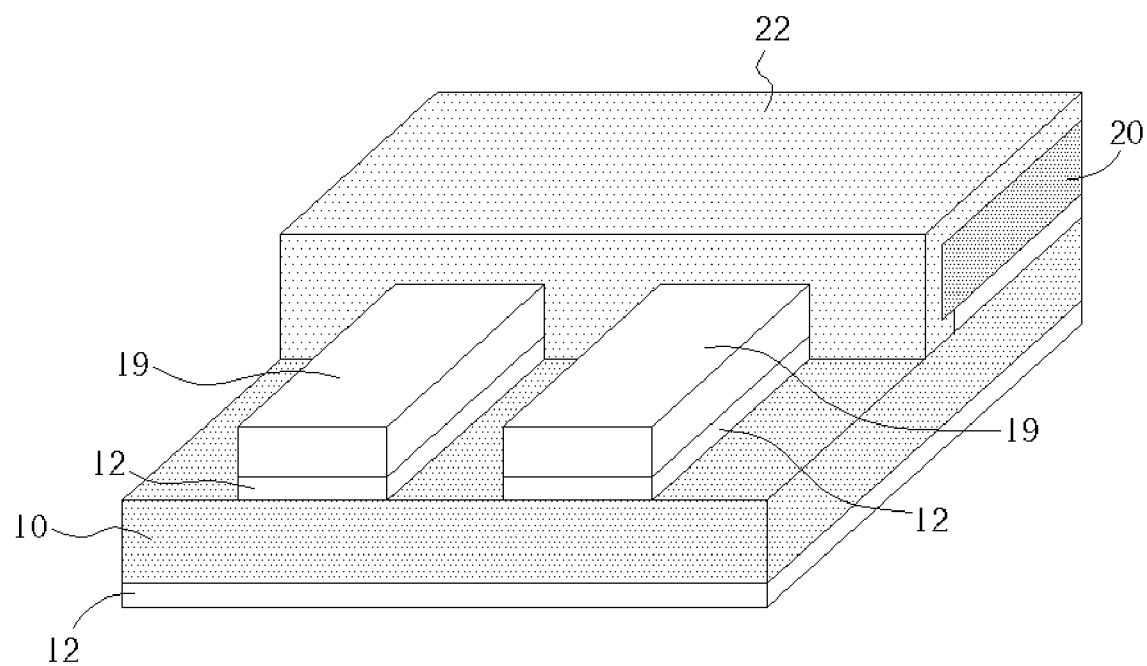

As shown in FIG. 6, a third photoresist coating is carried out. Conventional exposure and development processes are performed to form a patterned photoresist layer 22 on the photoresist layer 20. The photoresist layer 22 covers the exposed sidewall of the thin copper base layer 12 under the photoresist layer 20, which is formed in previous etching process. The photoresist layer 22 defines the to-be-Au-plating area (Au-plating area) 19 and prevents bridging of Au electroplating into the not-to-be-Au-plating area (non-Au-plating area).

In accordance with another preferred embodiment of this invention, before performing the third photoresist coating, the photoresist layer 20 is removed. The third photoresist coating and lithographic process are then carried out to form the patterned photoresist layer 22 that defines the to-be-Au-plating area 19.

Figure 7:
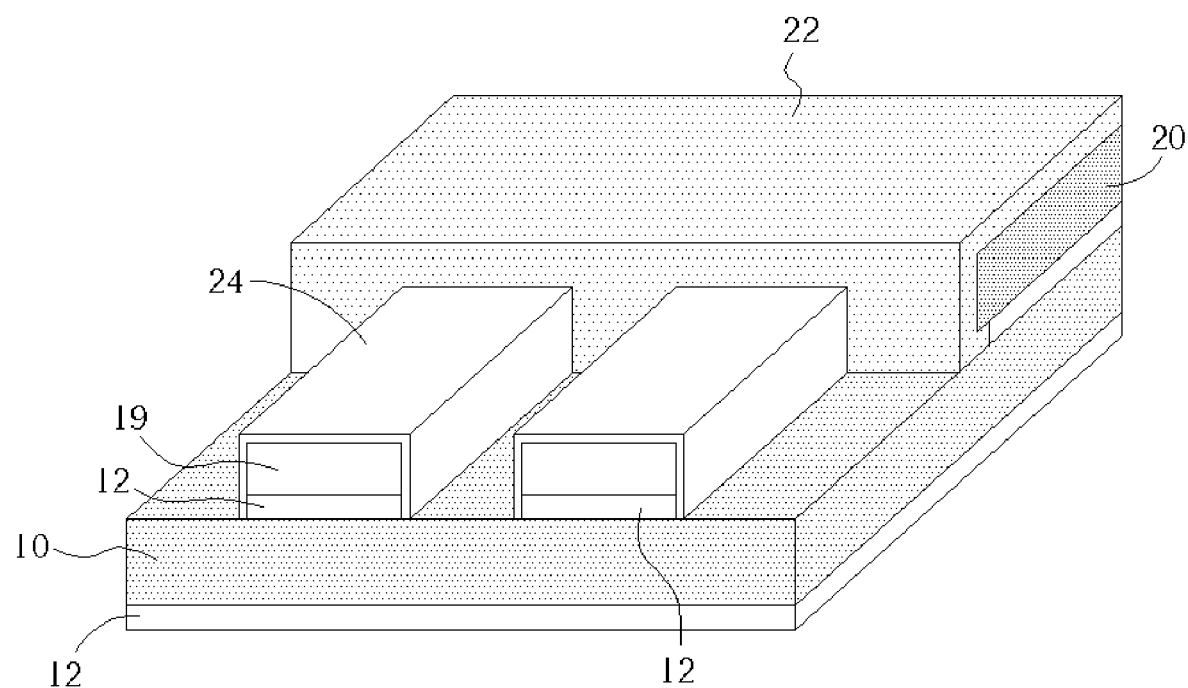

As shown in FIG. 7, an electroplating process is carried out to electroplate a metal layer 24 such as Ni/Au on the exposed copper circuit pattern 18 in the to-be-Au-plating area 19 including sidewalls of the exposed copper circuit pattern 18. The metal layer 24 completely covers the exposed copper circuit pattern 18 in the to-be-Au-plating area 19, such that oxidation of the copper circuit pattern 18 in the to-be-Au-plating area 19 is avoided.

Figure 8:
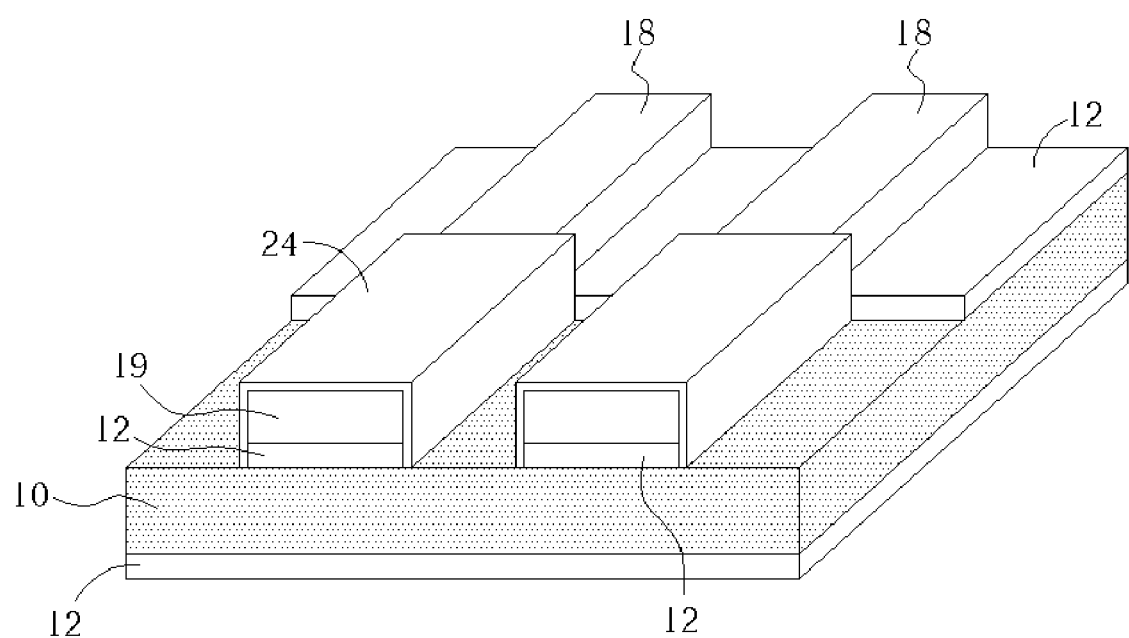

As shown in FIG. 8, the photoresist layer 20 and the photoresist layer 22 are removed to reveal the entire copper circuit pattern 18 and the remaining thin copper base layer 12.

Figure 9:
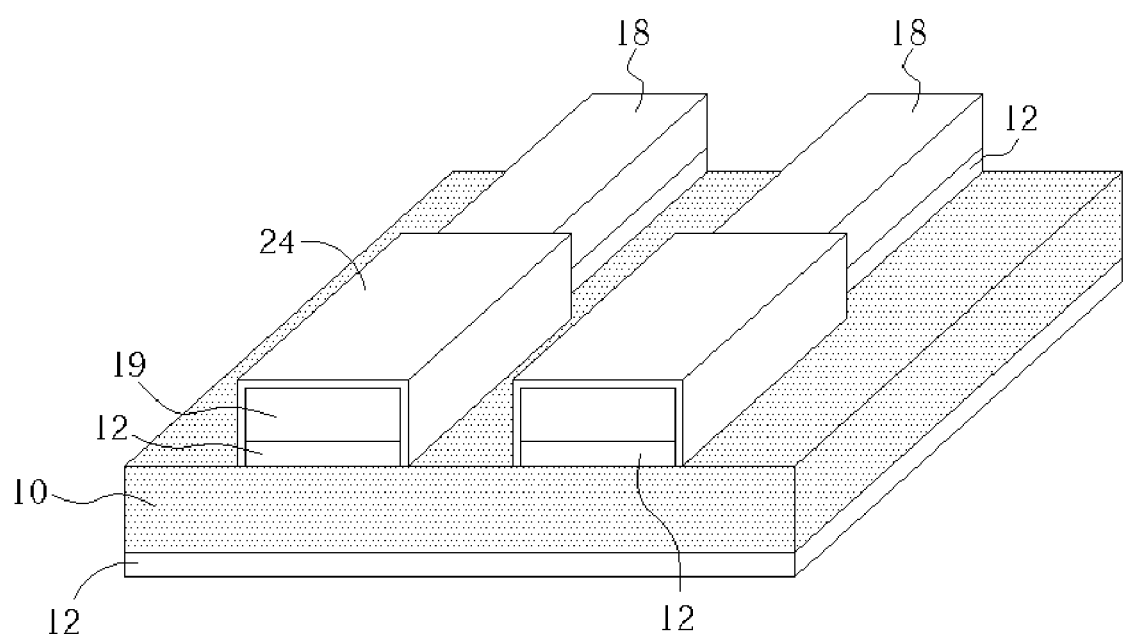

As shown in FIG. 9, using the metal layer 24 as an etching hard mask to protect the copper circuit pattern 18 in the Au-plating area 19, a second selective etching such as a wet etching is carried out to remove the remaining thin copper base layer 12 on the carrier plate 10, substantially leaving the Au-plating area 19 intact.

Figure 10:
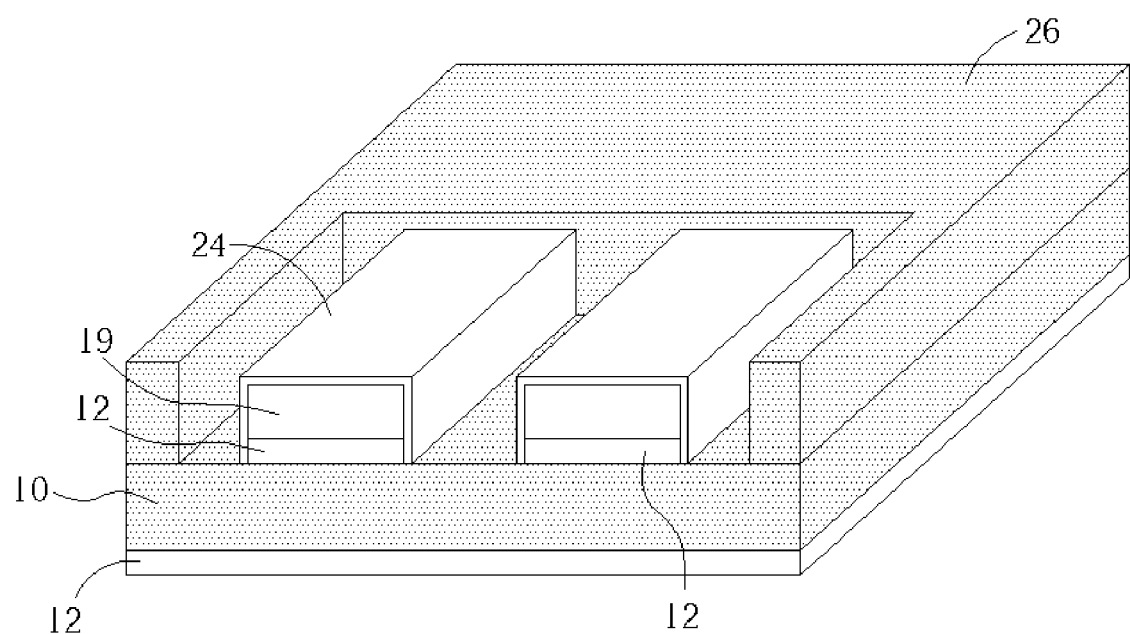

Finally, as shown in FIG. 10, a solder mask 26 is coated on the copper circuit pattern 18 and on the carrier plate 10. The solder mask 26 exposes the Ni/Au electroplated copper circuit pattern 18 in the Au-plating area 19.

To sump up, the present invention utilizes three photo image transfer steps and two selective etching to define the circuit area to be Au plating and the non-Au-plating circuit area. The first photo image transfer step is used to define the conductive circuit pattern for electroplating copper circuit lines. The first photoresist is removed after the copper circuit lines are formed on the thin copper base layer. The second photo image transfer step is used to define the circuit area to be Au plating and is used as an etching hard mask. The third photo image transfer step, which is stacked on the second photoresist layer, is used to mend the second photoresist having a recess thereunder for avoiding bridging during the electroplating process. The first and third photoresist layers are electroplating masks, while the second photoresist layer is an etching hard mask.

The present invention comprises at least the following advantages. First, the cost per substrate is reduced since there is no need to coat an additional conductive metal layer for electroplating after the definition of circuit pattern layout. The conductive materials used to assist electroplating include the thin copper base layer and the chemically deposited copper layer. The potential scratch or collision damages can be effectively prevented since the entire circuit pattern is revealed at a later fabrication stage. Further, metal peeling is avoided thereby promoting the production yield. Moreover, sidewalls of the circuit pattern in the Au-plating area are also covered by Ni/Au film and thus avoiding overhang problem.

Those skilled in the art will readily observe that numerous modification and alterations of the present invention method may be made while retaining the teachings of the invention. Accordingly, the above disclosure should be construed as limited only by the metes and bounds of the appended claims.

What is claimed is:

1. A method for fabricating a packaging substrate, comprising:

providing a carrier plate having thereon at least one thin copper base layer;

forming a first patterned photoresist layer on said thin copper base layer, said first patterned photoresist layer has a recessed trench area defining a copper circuit pattern;

electroplating copper in said recessed trench area to form said copper circuit pattern including a to-be-Au-plating area that has a larger surface area as the terminal of said copper circuit pattern;

stripping said first patterned photoresist layer;

forming a second patterned photoresist layer exposing said to-be-Au-plating area of said copper circuit pattern;

using said second patterned photoresist layer as an etching hard mask, etching away said thin copper base layer exposed by said second patterned photoresist layer and said to-be-Au-plating area;

forming a third patterned photoresist layer on said second patterned photoresist layer to mend a recess under said second patterned photoresist layer;

using said third patterned photoresist layer as an electroplating mask, electroplating a metal layer onto said copper circuit pattern in said to-be-Au-plating area;

stripping said second and third patterned photoresist layers; and etching away remaining said thin copper base layer being exposed after stripping said second and third patterned photoresist layers.

2. The method according to claim 1 wherein said metal layer includes Ni/Au.

3. The method according to claim 1 wherein after the step of etching away remaining said thin copper base layer, the method further comprises the step:

forming a solder mask on said copper circuit pattern.

4. The method according to claim 1 wherein said carrier plate is made of insulating materials.

5. The method according to claim 1 wherein said carrier plate is made of plastic.

6. The method according to claim 1 wherein said thin copper base layer has a thickness of less than 10 micrometers.

7. A method for fabricating a packaging substrate, comprising:

providing a carrier plate coated thereon with a copper seed layer;

forming a first patterned photoresist layer on said copper seed layer, said first patterned photoresist layer has a recessed trench area defining a copper circuit pattern;

electroplating copper in said recessed trench area to form said copper circuit pattern including a to-be-Au-plating area that has a larger surface area as the terminal of said copper circuit pattern;

stripping said first patterned photoresist layer;

forming a second patterned photoresist layer exposing said to-be-Au-plating area of said copper circuit pattern;

using said second patterned photoresist layer as an etching hard mask, etching away said copper seed layer exposed by said second patterned photoresist layer and said to-be-Au-plating area;

stripping said second patterned photoresist layer;

forming a third patterned photoresist layer on said carrier plate to expose said to-be-Au-plating area of said copper circuit pattern;

using said third patterned photoresist layer as an electroplating mask, electroplating a metal layer onto said to-be-Au-plating area;

stripping said third patterned photoresist layer; and etching away remaining said copper seed layer being exposed after stripping said third patterned photoresist layer.

8. The method according to claim 7 wherein said metal layer includes Ni/Au.

9. The method according to claim 7 wherein after the step of etching away remaining said copper seed layer, the method further comprises the step:

forming a solder mask on said copper circuit pattern.

10. The method according to claim 7 wherein said carrier plate is made of insulating materials.

11. The method according to claim 7 wherein said carrier plate is made of plastic.

12. The method according to claim 7 wherein said thin copper base layer has a thickness of less than 10 micrometers.

* * * * *